(12) United States Patent  
Ringler

(10) Patent No.: US 6,439,448 B1
(45) Date of Patent: Aug. 27, 2002

(54) LARGE WIRE BONDER HEAD

(75) Inventor: Andreas H. Ringler, Irvine, CA (US)

(73) Assignee: Orthodyne Electronics Corporation, Irvine, CA (US)

( * ) Notice: Subject to any disclaimer, the term of this patent is extended or adjusted under 35 U.S.C. 154(b) by 0 days.

(21) Appl. No.: 09/599,481

(22) Filed: Jun. 23, 2000

Related U.S. Application Data

(60) Provisional application No. 60/163,793, filed on Nov. 5, 1999.

(51) Int. Cl.[7] .......................... B23K 37/00; B23K 31/00
(52) U.S. Cl. ............................... 228/110.1; 228/180.5; 228/4.5; 228/1.1; 228/102
(58) Field of Search ................... 228/4.5, 110.1, 228/1.1, 180.5, 120

(56) References Cited

U.S. PATENT DOCUMENTS

| | | | | |
|---|---|---|---|---|
| 3,813,022 A | * | 5/1974 | Radobenko ................. 228/4.1 |
| 4,326,115 A | * | 4/1982 | Bartholet et al. .......... 219/56.1 |
| 4,475,681 A | * | 10/1984 | Ingle ....................... 219/56.21 |
| 4,550,871 A | * | 11/1985 | Chan et al. ............. 228/180.21 |
| 4,653,681 A | * | 3/1987 | Dreibelbis et al. .......... 228/102 |
| 4,824,005 A | | 4/1989 | Smith, Jr. |
| 4,955,523 A | * | 9/1990 | Calomagno et al. ........ 228/179 |
| 4,976,392 A | * | 12/1990 | Smith et al. ................. 228/1.1 |
| 5,176,310 A | * | 1/1993 | Akiyama et al. ........... 228/179 |
| 5,330,089 A | * | 7/1994 | Orcutt et al. ................ 228/1.1 |
| 5,395,038 A | * | 3/1995 | Olson et al. ................. 228/1.1 |
| 5,647,528 A | * | 7/1997 | Ball et al. ................ 228/180.5 |
| 5,868,300 A | * | 2/1999 | Babayan ................. 228/180.5 |
| 5,894,981 A | * | 4/1999 | Kelly .......................... 228/104 |
| 6,065,663 A | * | 5/2000 | Koduri .................... 156/580.1 |
| 6,118,175 A | * | 9/2000 | Anderson et al. ........... 257/676 |
| 6,206,273 B1 | * | 3/2001 | Beaman et al. ............. 219/106 |

FOREIGN PATENT DOCUMENTS

| | | | | |
|---|---|---|---|---|
| DE | 29810973 U1 | * | 11/1999 | ................. 228/4.5 |
| JP | 6-53291 A | * | 2/1994 | ................. 228/4.5 |

\* cited by examiner

Primary Examiner—M. Alexandra Elve
Assistant Examiner—L. Edmondson
(74) Attorney, Agent, or Firm—George F. Bethel

(57) ABSTRACT

An ultrasonic wire bonder is disclosed having a bonding head for bonding wire to an electrical or electronic component with a bonding tool. A flexible support formed from at least one arcuate arm, supports the bonding tool for flexible movement of the bonding tool in the Z axis. A pair of arms form a wire clamp supported on the flexible support and are articulated by a link connected for moving one of the arms with respect to the other by an electrical drive having a coil. A wire cutter is connected to the bonding head and a pusher pushes the wire cutter toward the bonding tool before wire is to be cut after bonding.

31 Claims, 7 Drawing Sheets

LARGE WIRE BONDER HEAD

This application claims the benefits of U.S. Provisional Patent Application Serial No. 60/163,793, filed Nov. 5, 1999, entitled a Large Wire Bonder Head, Inventor Andreas H. Ringler.

BACKGROUND OF THE INVENTION

1. Field of the Invention

The field of this invention is within the ultrasonic wire bonding art. More particularly, it is within the art of ultrasonically bonding a wire to an underlying substrate such as an electronic part, an electrical part, or a semiconductor. The invention falls into the category of ultrasonically bonding wire in a facile and quick manner.

2. Background of the Invention and Prior Art

The prior art with regard to ultrasonic wire bonding generally included the aspects of having a bonding tool lowered to a wire and applying ultrasonic energy through a transducer. As the ultrasonic energy was applied, a given amount of pressure was provided at the tip of the bonding tool in order to make a solid contact. This pressure was generally provided by certain types of springs, flexures, or other pressure.

The use of such springs and flexures oftentimes did not allow for a suitable pressure on the bond tool while at the same time preventing lateral displacement. This created disadvantages as far as control forces, life of the flexure, maintenance, and axial and spring force offsets. Many of such flexures and springs were based upon being formed as a parallelogram.

This invention overcomes the deficiencies of such flexures by having a spring system with an inner cylinder and an outer cylinder. The two respective cylinders can be generally described as an inner cylinder supported on a ring or outer cylinder at an upper and lower end. The ring flexes upwardly and downwardly through its bending moment.

The spring and ring configuration can be made of a number of arcuate arms preferably three in number in approximately 120° arcuate segments. The arc shaped portions of the ring or beam provide for a greater free movement. At the same time they provide relative stability with regard to the end of the bond tool or other components to which they are attached.

The invention specifically utilizes two respective rings that are formed as stacks, disks, or sheets of material such as metal substantially perpendicular or normal to the axis of the tools and Z axis of the bonder.

The use of small stacks of flexures or ring segments is in the form of two or three stacked portions. Each one respectively provides for an improved degree of stiffness while at the same time providing sufficient flexure to create the proper displacement.

One of the problems of the prior art was the articulation of the wire clamps and the design of wire guides. With the increased tightness of looping of wires from one bond to another along with lower height loops and pull tests, the disadvantages of the prior art have become pronounced. Further to this extent, the opening and closing of the wire clamps was usually done on a mechanical basis. Time was spent when substantially rapid movement was required for moving from one bond to the next. This is particularly true when considering the pull test function wherein wires are pulled in order to test the strength of the bond.

In order to improve the speed of the opening and closing of the wire clamps, this invention utilizes a coil and magnet system. They are driven to open and close the clamps thereby reducing inertia and other characteristics of movement that slowed down the movement. The clamp force is also able to be controlled by software.

In order to do this, a coil and magnet such as a voice coil combination is attached to the bond head and moves in the Z axis. When the voice coil is energized, the beam, link, or lever on which it sits moves about a pivot point rotating the clamps. When the coil is pushed downwardly, it opens the clamps and when the coil is moved upwardly, it closes the clamps.

The foregoing functioning elements reduce friction loses, inertia and other characteristics that were encountered in the prior art.

Another improvement is that the wire guide is designed so that it fits around the clamps, or alternatively stated the clamps are within the wire guide.

All of the foregoing provides for improved features as to the mechanical movement, speed, and accuracy of the clamps providing various programmable clamp forces. Further to this extent, the wire guide and the fixed clamp cut down on manual adjustments inasmuch as there is only one moving part. Finally, when the clamps are inserted into the wire guide, the opening distance is automatically established.

Another problem with the prior art is that the cutter in order to cut the wire was in a laterally displaced relationship to the bond tool. In order to provide for a cut when the Z axis movement is encountered, the space between the bond tool and the cutter created a larger length of wire remaining than was desired. In order to cure this, a motion, pushing, or movement of the cutter toward the bond tool is desirable.

In order to accomplish this, a drive for the cutter blade in this invention causes it to be pushed or moved toward the bond tool during the cutting motion when it moves in the Z axis. This is done by a piezoelectric stack that moves the cutter blade around a flexure point. When movement is encountered, it moves the cutter into sufficiently close proximity to the bond tool. This helps to eliminate the larger tail encountered if a space were opened significantly between the bond tool and the cutter.

By using the piezoelectric stack with a flexure pivot point, it allows the articulation of the cutter to follow the front surface of the bond tool during the cut. This provides for improvement of the front cut of the wire thereby creating improvements with regard to wire bonding on very small surfaces such as semiconductors.

For the foregoing reasons, it can be seen that this invention has numerous features that solve the problems of the prior art that have not been solved to this point.

SUMMARY OF THE INVENTION

In summation, this invention comprises a novel large wire ultrasonic bonding head having highly improved flexural support for the bonding elements with an improved wire clamp and wire guide and further incorporating an active laterally moving cutter for the wire.

More specifically, the flexure assembly comprises an outer ring or supporting spring flexure formed of multiple arcuate arms and an inner cylinder portion supported on the arcuate arms. The inner portion supports the active components of the wire bonding elements. This includes the bonding tool, the wire clamps, and the wire feed. The support of the bonding elements on the circular ring creates an improved spring decoupling function while at the same time reducing lateral displacement, and eliminating friction. Further improvements include the use of a fillet at the connection point of the spring members or arcuate arms to reduce fatigue, and a pocket into which they can bend or flex.

The wire clamps and wire guide are improved by virtue of the wire clamps being actively driven by a programmable coil and magnet which can be referred to as a voice coil. In this manner, the clamps can be driven as to clamping movement and timing over a broad range while at the same time providing faster wire clamping action.

A wire guide surrounds the clamps and seats the clamps therein. The wire guide is suspended on the fixed arm of the clamp and provides for improved connection of the wire guide and ease of adjustment.

An active laterally displacing member for the cutter blade is utilized which moves the cutter blade into close proximity with the bonding tool. This is performed by a piezoelectric stack or any other active moving means to place the cutter into a closer proximity with the bond head. Close cropped cuts of wire can be performed for improved bonding in narrow and reduced areas of semi-conductors and other electronic components.

From the foregoing summary and background of the invention it will be seen in light of the following description of the preferred embodiments that this invention is a significant step over the art of wire bonding heads.

DESCRIPTION OF THE PREFERRED EMBODIMENTS

Figure 1:
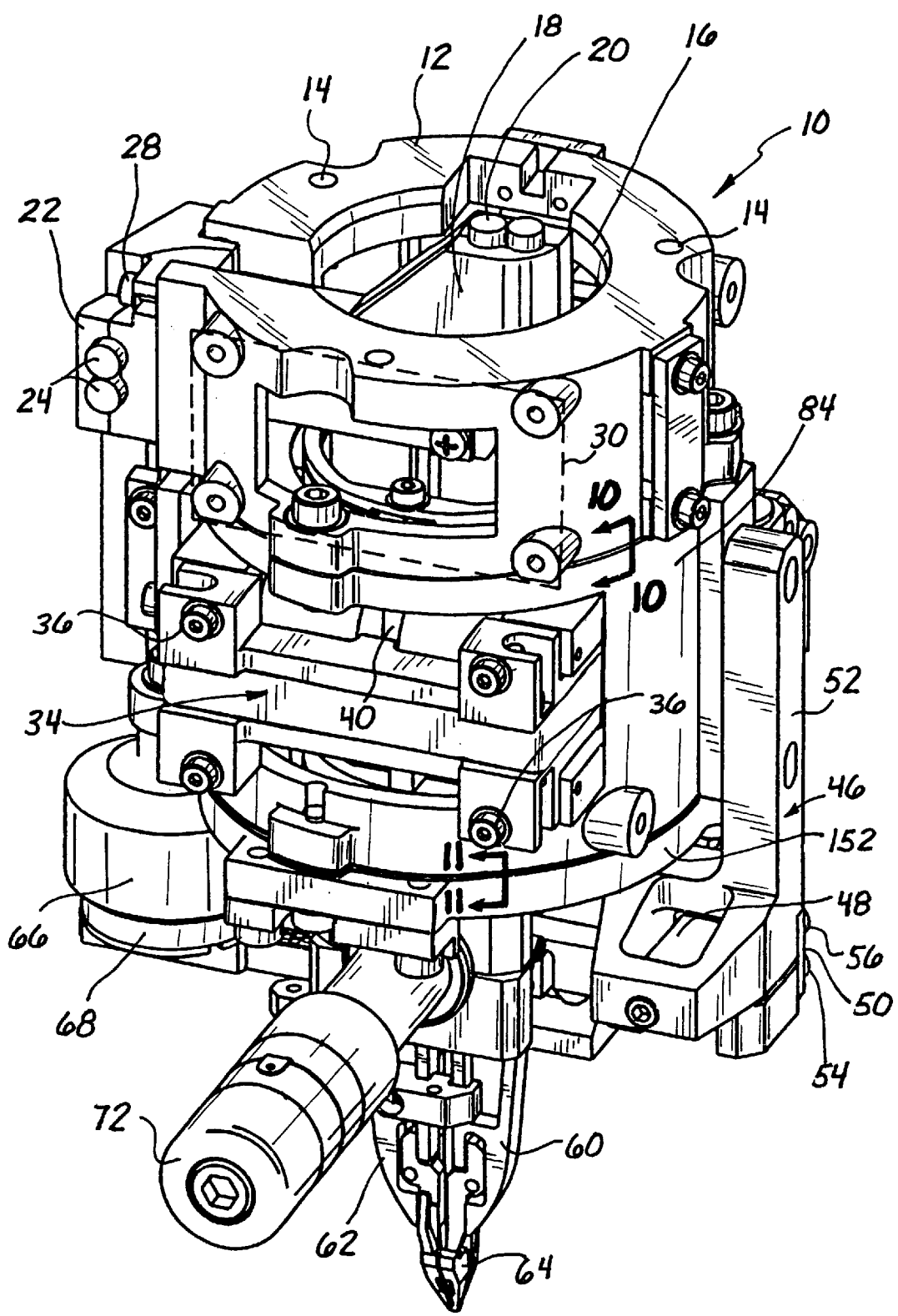
FIG. 1 shows a perspective view of the wire bonding head with wire bonding elements at the lower end and an attachment collar for attachment to the support tube of the bonder.
Figure 2:
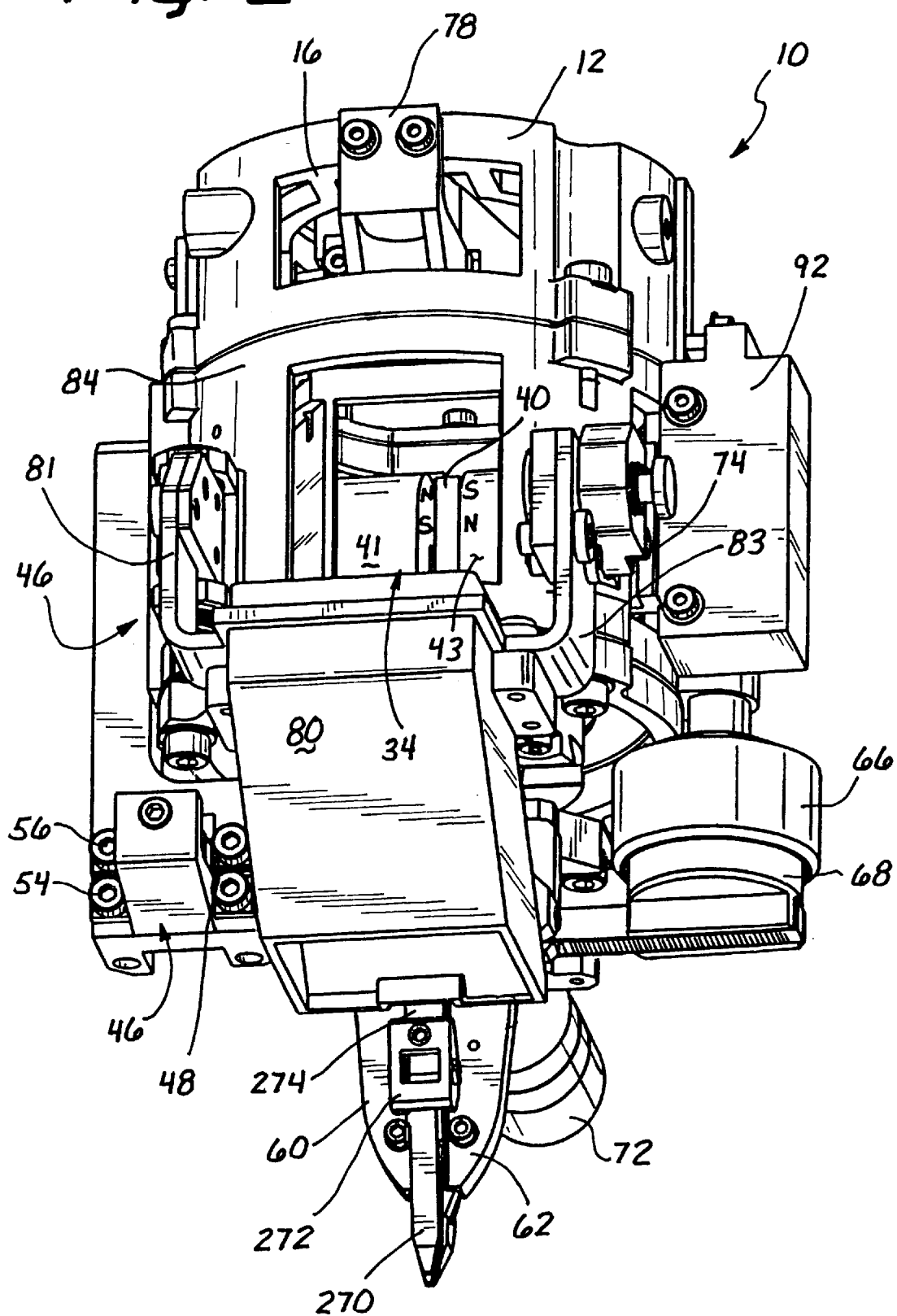
FIG. 2 shows a perspective view opposite from that of FIG. 1 of the wire bonding head.

Looking more particularly at FIGS. 1 and 2, it can be seen that the large wire bonder or bonding head of this invention has been shown. The bonding head is attached to the bonder equipment and moves by means of a Z direction support tube to move in a vertical upright direction or rotationally. The Z tube control connection moves the bonding head with respect to its location over an ultrasonic bond that is to take place. The bond head also moves in X & Y directions. The work is stationary during bonding.

In particular, the bonding head 10 has been shown having a casting, collar, or upper cylinder 12 that specifically has tapped openings 14. The tapped openings 14 secure the bonding head to the Z tube (i.e. upright connection) of a bonder in order for it to move over the surface of the area on which an ultrasonic bond is to take place. Fundamentally, the casting 12 is a mounting bracket or mounting member. It can be configured in any particular manner so long as it attaches to the Z tube which moves the bonding head upwardly and downwardly, rotationally, and in other modes. The bonding head Z tube connection can also move in an X–Y direction in this case.

An opening 16 is shown within the bonding head which receives a cable guide 18 having cables 20 which serve the electronic and control functions of the bonding head. A second cable guide 22 is shown in which cables 24 which are the same as cables 20 emanate from.

The cable guide can be mounted by a mounting screw 28 and the cables can be interconnected to a circuit board generally dotted in as circuit board 30. The circuit board 30 provides for the controls through various integrated circuits and other control functions in concert with the signals and power provided through the cables including cables 20 and 24. The circuit board 30 can be a printed circuit board and junction board, and have various electronic functions provided thereon for the bonding head.

In order to drive the bonding tool and other elements with sufficient force against the work to be bonded, a forcer assembly 34 is shown. The forcer assembly 34 includes mounting screws such as screws 36 to secure it to the bonder head. The forcer magnetically drives the bonding tool into forced relationship on the work at a pre-established or desired level of force. This is provided by a magnet seen as magnet 40 which shall be detailed in greater detail in FIG. 5. Coils 41 and 43 on either side are also shown that provide the force to the magnet 40 to drive it downwardly.

In order to provide for active pushing or lateral movement of the cutter against the bonding tool, a pusher assembly, arm, or active pusher 46 is shown which has a piezoelectric stack 48 for providing the pushing force. This is done at a flexure or spring member 50 that is shown connected to the fixed portion of the pusher assembly 46 namely upper portion 52 to which the flexure is connected by screw 56 to the moving part by screw 54. The piezoelectric stack 48 expands and then movement is returned by forced spring movement that will be detailed hereinafter.

The bonder head incorporates a moving clamp arm 60 for clamping the wire with a fixed clamp arm 62. A wire guide 64 for guiding the wire is shown. The features with regard to the clamp arms and the clamps with the wire guide, cutter, and bonding tool will be detailed in greater detail in FIG. 7 and some of the other figures.

Looking more particularly at FIGS. 1 and 2, it can be seen that a permanent magnet 66 with a coil 68 has been shown. The permanent magnet 66 and the coil 68 articulate the movement of the clamp arm 60 by means of an arm and lever function which will be detailed in the figures such as FIG. 3 hereinafter.

In order to provide for bonding, a transducer 72 is shown connected to a bonding tool 278. The transducer 72 is of a standard type which converts electrical energy to ultrasonic vibrations for purposes of driving the bonding tool 278 for an ultrasonic bond.

FIG. 2 shows the forcer assembly in slightly greater detail with coils 41 and 43 providing for the electrical field to drive the magnet 40 with regard to the bonding tool. The magnetic orientation of the magnets is a pair of magnets which are fundamentally south, north looking at the top and north, south looking at the bottom.

In order to provide for pattern recognition and the format of the way a bond is to be made, an optical system through the Z tube at the upper end is utilized. In particular, a bracket 78 mounts an optical lens which provides for pattern recognition. In order to guide the movement of the light correctly, a light box 80 is mounted by depending brackets 81 and 83. This provides a wide angle coaxial light source through its opening and then to the optics for pattern recognition and movement of the bonding head over the work to be bonded.

A lower tubular member 84 analogous to tubular member 12 is shown which interconnects the respective flexures and other components that will be detailed hereinafter.

In order to accommodate the movement of the bonding tool with respect to the transducer, a linear encoder 92 is provided. The linear encoder 92 is such where it encodes the movement of a depending member 94 connected to a transducer bracket.

Figure 6:
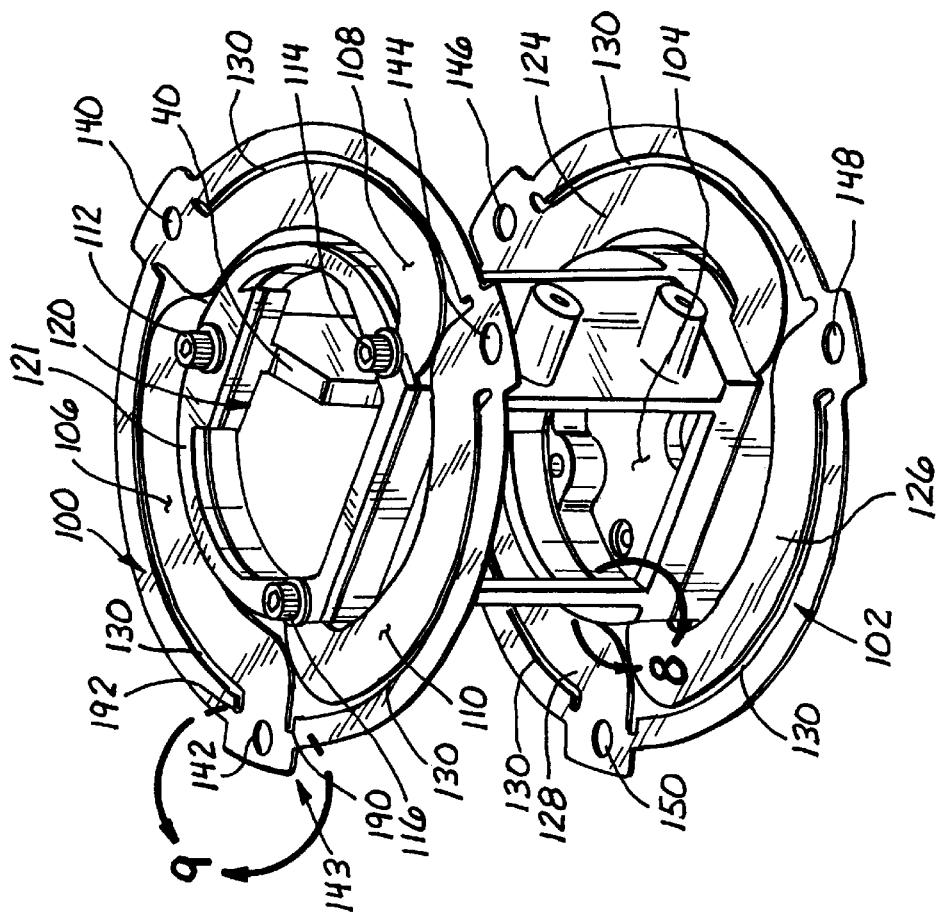
FIG. 6 shows a perspective view of the arcuate ring flexures and cylinder or cage that supports the bonding elements of the bonder.
Figure 5:
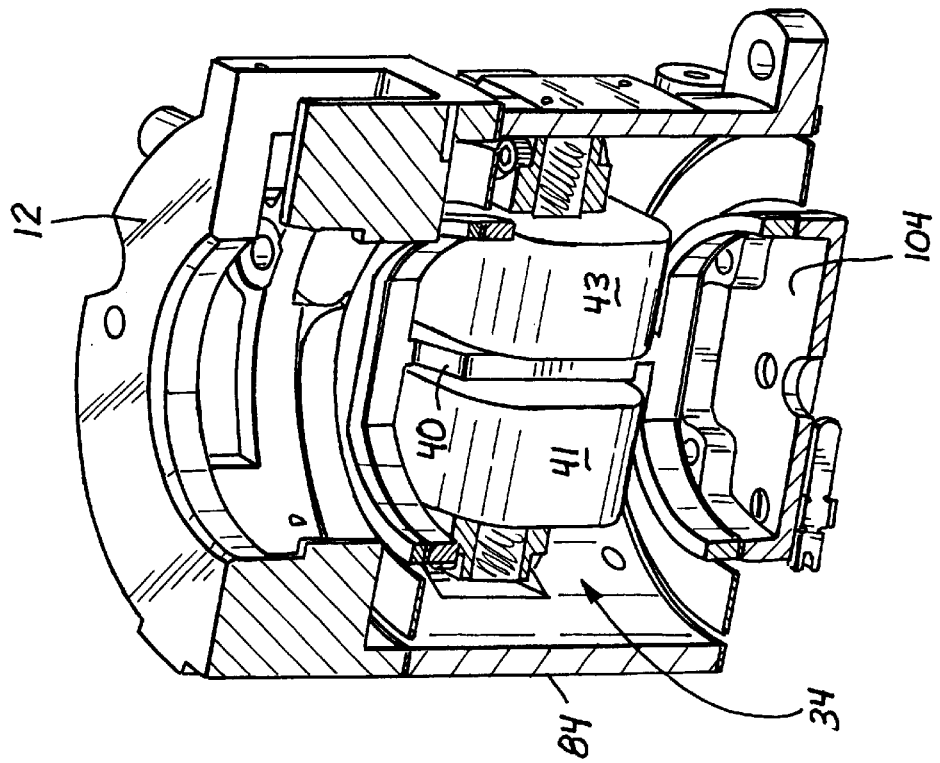
FIG. 5 shows a sectional view of the forcer which forces the bonding tool into close proximity with sufficient force to create a bond.

Looking more specifically at FIGS. 5 and 6 it can be seen that the upper cylinder 12 and the lower cylinder 84 are connected together. Within the interface of the two respective cylinders are a grouping of flexure assemblies. The flexure assemblies incorporate a stationary outer ring 100 having arms. A lower outer ring 102 is also shown connected to the interface of the lower cylinder 84 and the underlying brackets.

These two respective rings or arcuate configurations 100 and 102 serve to support an inner cylinder, cage or housing 120 on the respective arms. The cylinder or cage terminates in a transducer and bonding tool bracket or plate 104. Ring 100 has three arcuate, circular, curved, bowed arms, serving as spring flexures 106, 108, and 110. These arms 106, 108, and 110 are three in number and terminate in an arcuate bend, and are secured by screws 112, 114, and 116. The securement screws 112, 114, and 116 secure the inner cylinder 120 that depends downwardly and terminates at the transducer mounting bracket which mounts the transducer, wire clamps, bonding tool, and moves as an over travel assembly by virtue of the spring load of the flexures.

In order to further enhance the spring load on the cylinder 120, the lower ring 102 incorporates arcuate, circular, curved, arcuate, or bowed arms 124, 126, and 128. These arms 124, 126, and 128 like the foregoing arms 106, 108, and 110 are arcuate in appearance and spaced from the outer ring 100 by gaps 130. These gaps 130 allow for flexible movement upwardly and downwardly of the respective arms so that they can act as multiple spring flexures working in concert to support cylinder 120.

The spring flexures or arms 106, 108,.110, 124, 126, and 128 all respectively of an arcuate curvilinear shape transcribe the inner portion of the rings 100 and 102, and are three in number. The three in number, when considering the fact they circumscribe generally the interior area circumscribe approximate arcs of 120° each.

The arms 106, 108, 110, 124, 126, and 128 can be reduced to two in number or enlarged to four or greater in number. However, it has been found that the maintenance of three in number allow for sufficient stiffness and flexure of the arms while at the same time prevent offset and canting movement of the inner cylinder 120 which they support. This is important because of the fact the transducer mounting bracket, or plate 104 should be stabilized to avoid any kind of significant lateral movement while at the same time allowing axial up and down movement by support on the flexures.

The flexures can also be formed as a single diaphragm circumscribing the cylinder 120 and supported with tabs extending under the screws.

The outer rings of flexures 100 and 102 are secured by screws or bolts passing through openings or tabs 140, 142, 144, 146, 148, and 150. These openings 140, 142, 144, 146, 148, and 150 serve to secure the outer rings 100 and 102 by the tabs respectively surrounding the openings that are emplaced between the upper cylinder 12 and the lower cylinder 84 in the case of the outer ring 100 and in the lower plate or mounting bracket 104 and the lower cylinder 84.

Figure 8:
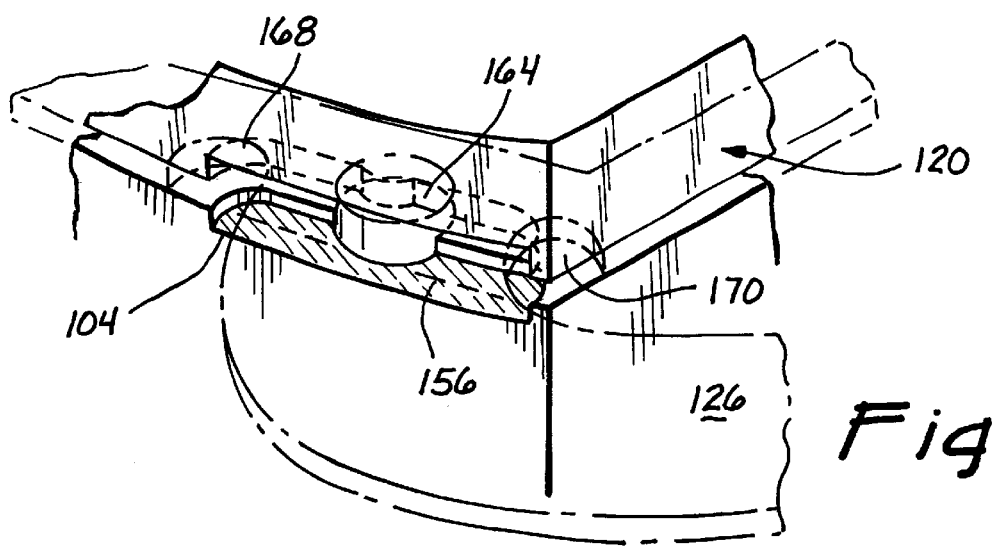
FIG. 8 shows a perspective view of the fillets which are utilized to reduce stress in the arcuate arms of the flexural support as shown and taken through circle 8 of FIG. 6.
Figure 9:
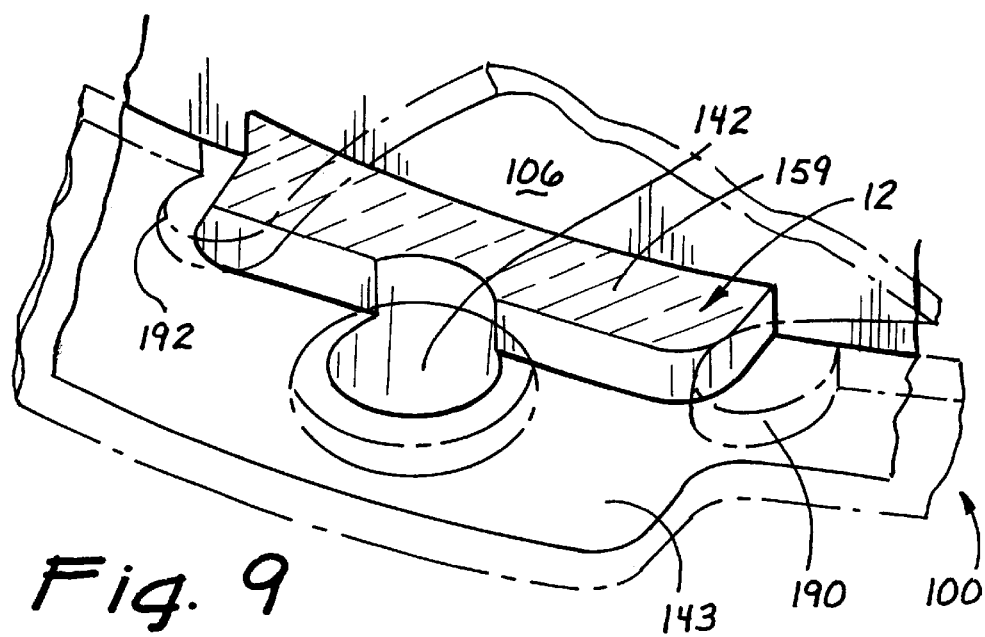
FIG. 9 shows a perspective view of the stress reducing fillets with curved indentations taken in the direction of circle 9 of FIG. 6.

The rings 100 and 102 with their respective arcuate arms follow a curved shape or bend terminating in the clamping areas on the cylinder or cage 120 which has a clamping plate 121 thereabove it. When clamping the arcuate arms, significant stress can be eliminated by the configuration shown in and detailed in FIGS. 8 and 9. In particular, FIGS. 8 and 9 show a reduced stress area by inclusion of fillets with pockets 156 and 159. These can be seen where the arms originate and in particular where they terminate into the areas between the clamping plate 121 and cylinder 120 as well as plate or bracket 104 forming a lower clamp against cylinder or cage 120. This is seen in FIGS. 8 and 9 in the form of those areas that have been removed from circles 8 and 9 of FIG. 6.

Looking more particularly at FIG. 8, it can be seen that the lower mounting plate or bracket 104 is shown clamping the arm 126 of the lower ring 102 against the cage or cylinder 120. This clamping action is such where the screw passes through an opening 164 to hold the arm 126. Where the arm 126 passes into the area between its upper and lower clamps namely plate or bracket 104 and the base of the cylinder or cage 120, it can be seen that the arm 126 develops significant stress along the interfacing line.

The foregoing tends to create a situation where the stress can cause a fracture of the arm 126 where it terminates into the clamped securement between lower bracket 104 and cylinder 120. In order to eliminate this, fillets or round indentations 168 and 170 are utilized. These fillets or round indentations 168 and 170 can be in any configuration so long as they provide for a uniform stress relief in a curved manner. Fillets 168 and 170 function with a relief pocket 156 in order to be more effective. This results in the arm 126 bending toward a relief pocket 156. In effect it bends inwardly to pocket 156 so that the transition does not form a significant stress riser.

The foregoing principle and action also applies to the mounting shown in FIG. 9. The mounting opening 142 which receives a bolt or screw as held in place at a tab 143 which is analogous to all the tabs surrounding openings 140, 142, and 144 as well as the openings 146, 148, and 150. The tabs are such wherein they would normally create stress in the area at their interface but for a certain limitation of stress by fillets 190 and 192 which extend inwardly into the area which is clamped. The fillets 190 and 192 are adjacent a relief pocket 159 to receive the bending of arm 106 into the pocket 159. These fillets, roundels or curved indentations help to limit stress such that the place where the mounting takes place will not fracture as readily when moving upwardly and downwardly over a long period of time due to flexural fatigue.

Without the relief pockets 156 and 159 the bending stresses at entry to the clamped surfaces would be higher with or without the fillets which applies to both FIGS. 8 and 9. The relief pockets 156 and 159 are shaped so that the area around the fillets isn't severely clamped, allowing the forces to smoothly transition without raising the stress too high.

By providing the fillets or rounded indentations and relief pockets in any particular configuration in the area where the arms or ring tabs are to be clamped, improved fatigue strength is developed as well as other improvements in the entire operation of the flexure.

The flexure comprising rings 100 and 102 have been made in such a manner where they incorporate two pairs of thin flexures for ring 100, and three for ring 102. They are formed from metal sheets or thin plates. A pair of stacked rings or sheets two in number comprise ring 100. Flexure 102 is formed of three stacked rings or sheets. These can be seen in sectional portions along lines 10—10 and 11—11 in both FIGS. 1 and 6.

There are two metal sheets 602 and 604 in the upper ring 100 and also the respective arms 106, 108, and 110. These are separated by a washer or spacer 606 in both the inner and outer portions.

Figure 10:
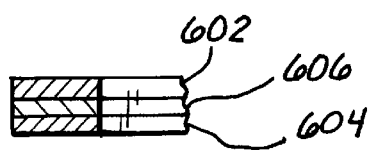
FIG. 10 shows a sectional view of the double stacked sections of the upper arcuate arms in the direction of lines 10—10 of FIG. 6.
Figure 11:
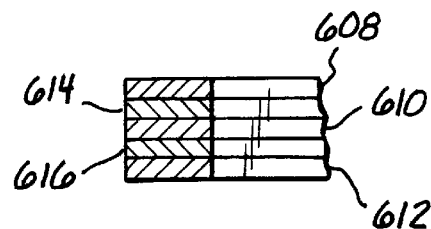
FIG. 11 shows a sectional view of the triple stacked sections of the lower arcuate arms in the direction of lines 11—11 of FIG. 6.

In the lower ring 102 there are three respective stacks or sheets 608, 610, and 612 as can be seen in FIG. 11 that comprise the ring including arms 124, 126, and 128. These again are spaced by spacers or washers 614 and 616. The two and three respective stacks of sheets or thin plates shown in FIGS. 10 and 11 for the rings 100 and 102 allow a flexure wherein a greater stiffness is provided as far as lateral movement or offset movement by ring 102 compared to ring 100. At the same time, axial movement is maintained upwardly and downwardly such that sufficient flexure is given to the movement of the transducer mounting plate or bracket 104.

The foregoing structure allows bending moments imposed against the mounting bracket 104 to be offset at a greater lever arm. The ratio is such wherein the differences in distance between rings 100 and 102 can control the amount of flexural strength and lateral movement between the two respective rings.

For instance, if increased distance between ring 100 and 102 is desired, an even lesser ratio of three to two insofar as flexural spring strength of the sheets could be utilized. This applies to the ratio of sheets 602 and 604 related to sheets 608, 610, and 612. However, when considering the overall height requirements of the bond head, it is felt that the approximate two to three ratio of the ring 100 to the ring 102 insofar as flexural strength and offset axial movement is concerned is generally desirable. This takes into consideration the moment arm or movements against the bonding tool and other portions of the bond head as will be described hereinafter.

The transducer mounting bracket or plate 104 and the cylinder 120 that are suspended on the arms of the rings 100 and 102 fundamentally are an over travel or decoupling assembly. When the Z tube holding the transducer bonding head moves downwardly, it allows for take up or decoupling of the transducer and in particular the bonding tool 278 on contact. When supplemented with the forcer by the magnet attached thereto and their respective coils 41 and 43 that drive it, the action of the over travel assembly or decoupler in its entirety can be spring loaded and operate to cushion any impact and at the same time move and force in concert for a proper bond.

Figure 3:
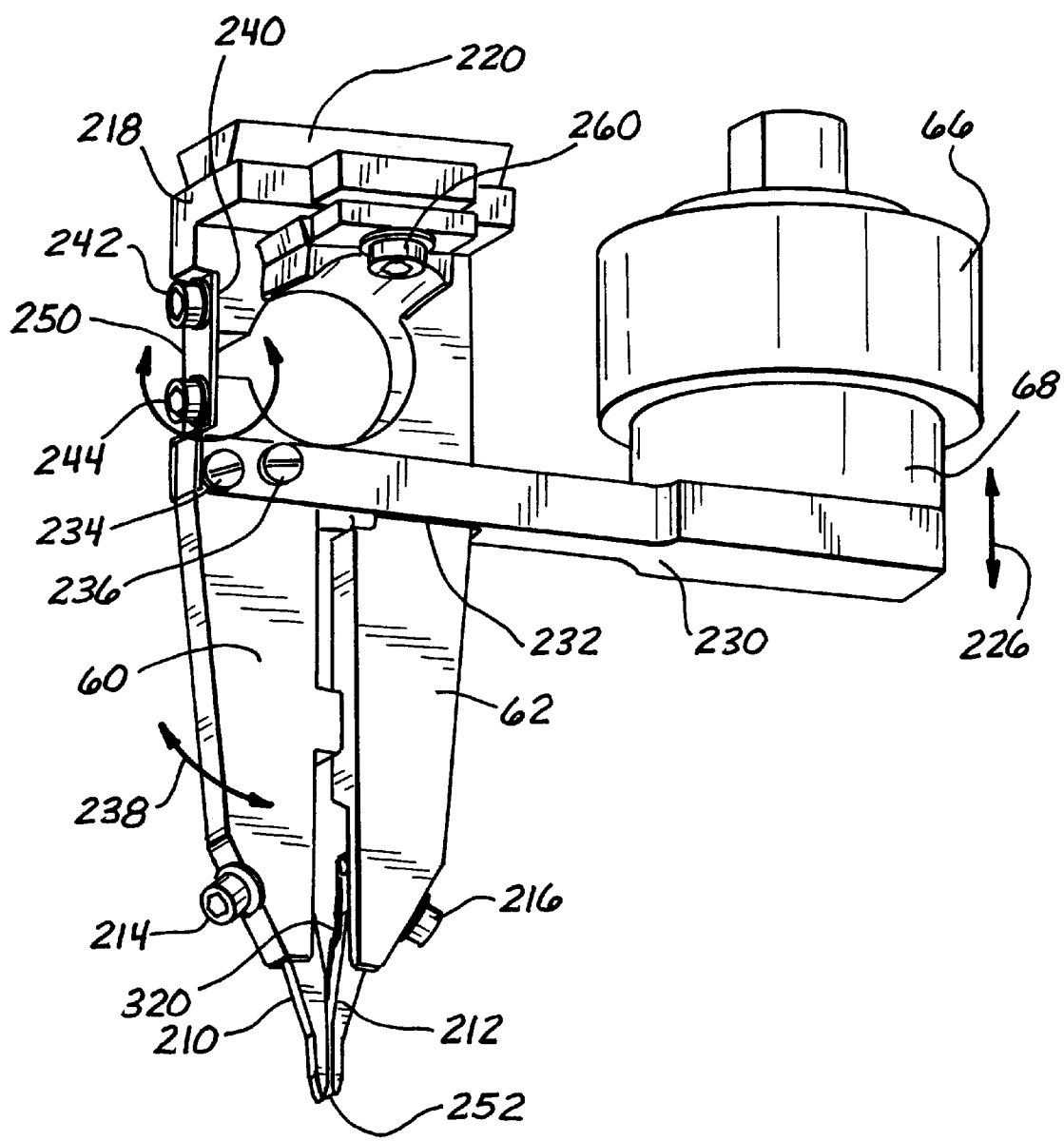
FIG. 3 shows a perspective view of the wire clamps of this invention and a detailed view of the coil assembly which moves the wire clamps.

Looking more particularly at FIG. 3, it can be seen that the wire clamps have been shown which hold the wire and can also be utilized for the pull test and other functions that is customary with ultrasonic bonding. The wire clamps are supported by clamp arms 60 and 62. Clamp arm 60 is the moveable clamp arm, while clamp arm 62 is the stationary, fixed, or static clamp arm. These respective clamp arms 60 and 62 incorporate the wire clamps or pincers 210 and 212. These pincers or clamps 210 and 212 hold wire between them and are secured to the clamp arms 60 and 62 by screws 214 and 216.

The clamp arm 62 extends as a continuous portion of mounting block 218. The clamp arm mounting block 218 has a dove tailed portion 220 that slides into the mounting plate 104.

The clamp arm 60 is operated by the voice coil comprising the coil 68 and a magnet 66 as previously indicated. The clamp opens and closes by movement of the coil 68 within the magnet 66 in the direction of arrow 226. As the coil 68 moves upwardly, the clamps 210 and 212 perform a clamping function. As the coil 68 moves downwardly, the clamps are released.

The clamp arms 60 and 62 are such wherein clamp arm 62 is fixed and a lever arm or actuating arm 230 is utilized. Actuating arm 230 spans or straddles fixed arm 62 on either side with a space 232 on either side. The lever arm 230 is secured to the moveable arm by screws 234 and 236. This allows them to move the arm 60 in an arcuate manner in the direction of arrow 238.

The pivoting support of the moveable arm 60 is provided by a flexure or spring member 250 formed as a rectangular leaf spring secured by screw 242 to the upper mounting block 218 and screw 244 at its lower portion to the moveable arm.

As the coil 68 moves upwardly and downwardly, it causes the flexure 250 to bend. This moves arm 60 inwardly and outwardly to pinch a wire at a nip 252 between the clamps 210 and 212.

Figure 4:
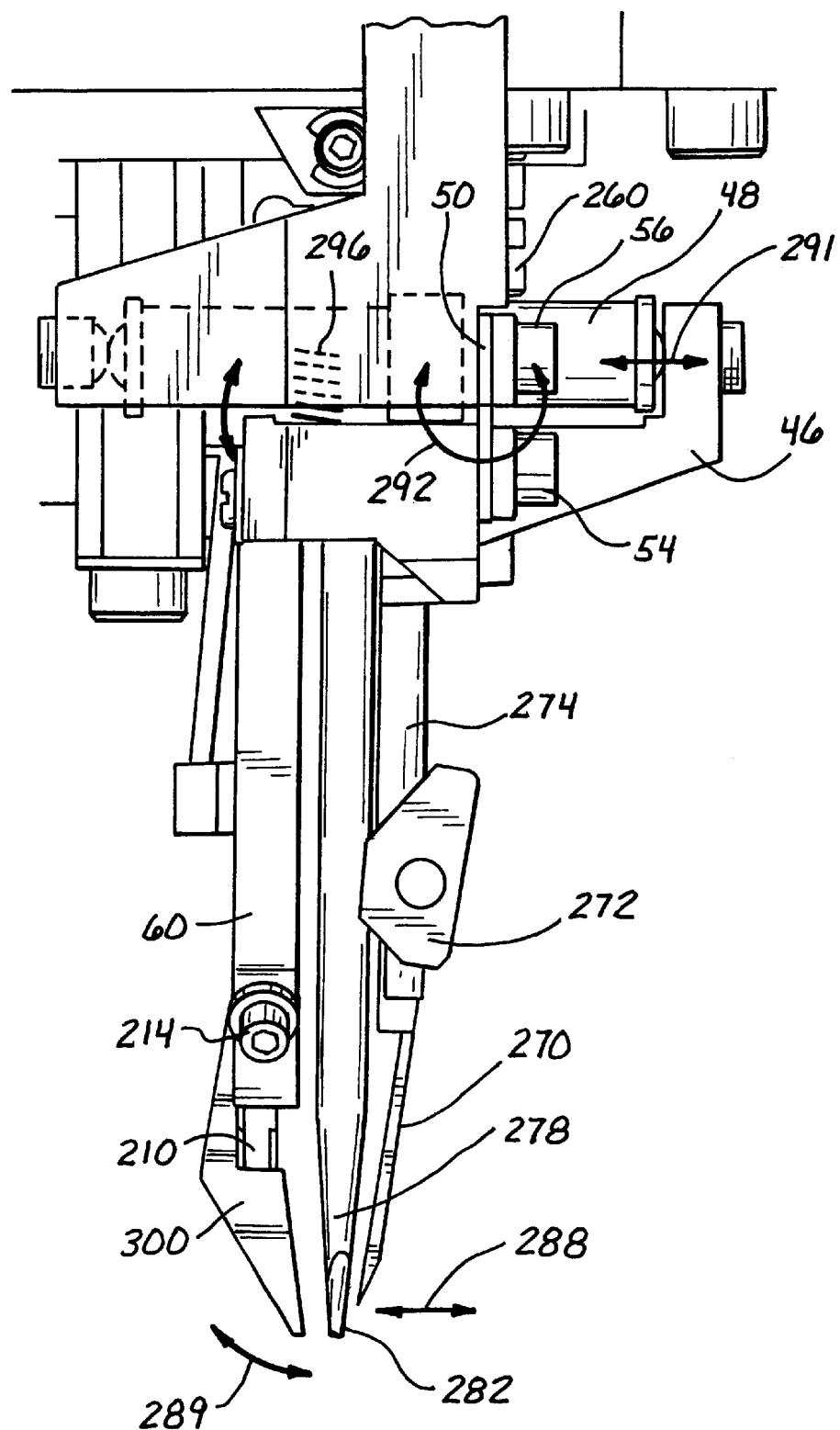
FIG. 4 shows a side elevation view of the bond tool, wire clamps, wire guide, and cutting blade connected to the bonding head, and details the cutter blade articulation and drive therefor.

Screw 260 moves both clamp arms 60 and 62 in a canted manner in the direction of arrow 289 as seen in FIG. 4. It also moves the clamp arms 60 and 62 toward the bond tool 278. This is used to adjust the clearance between the wire guide and bonding tool 278. (see FIG. 4)

FIG. 4 shows the active pusher of this invention which pushes the cutter blade into close proximity with the bonding tool 278. Looking more specifically at FIG. 4 with the other showings, it can be seen that a cutter blade 270 has been shown. The cutter blade 270 is mounted onto a clamping securement 272 holding the blade 270. The active drive unit is formed as a depending member which is secured to the arm to be described hereinafter for actively moving the cutter blade 270. This member is a depending extension 274 that is connected in the manner hereinafter set forth.

When looking at FIG. 4 it can be seen that the bonding tool 278 has been shown which is connected to the transducer 72 for direct ultrasonic vibration at its tip or end 282.

It can also be seen that the moving clamp arm 60 is shown with its attendant screw fixture 214 in order to secure the clamp 210 to the arm 60.

The reason for the movement of the cutter blade 270 into close proximate relationship with the end or tip 282 of the bonding tool 278 is to provide for the closest practical cutoff of the wire that has been bonded near the tip 282. This is to allow for significantly closer and smaller bonds which are required with regard to integrated circuits and other electronic components. In order to do this, the arm 274 to which the cutter blade 270 is attached moves the cutter blade into proximate relationship during the cutting operation.

The cutting operation is performed by movement of the Z tube or bond head movement drive to which the collar 12 of the bonder head 10 interconnects with the Z tube. Thus, movement of the Z tube downwardly drives the cutter blade 270 into a position proximate but normally slightly spaced from the end 282 of the bonding tool 278. The pusher's proximate movement of the arm 274 with the cutter 270 into adjacent relationship with the bonding tool 278 accomplishes a close cutting relationship. An undesirable gap which can be seen remains between the bonding tool 278 and the cutter blade 270 without such a pushing movement. In effect, for proper cutting when the Z tube moves the bonder head 10 downwardly, the cutter blade 270 should move to the left in the direction of arrow 288. When relaxed, it moves to the right of arrow 288.

It should also be born in mind that the Z tube connection or drive connected to collar 12 moves the bonder head and components not only in the up and down Z direction, but also rotationally and in the X-Y direction.

In order to accomplish the active pushing of the cutter 270, a piezoelectric stack 48 is utilized. The piezo stack 48 is connected to an upright angle arm 46. The upright angle arm 46 allows the piezo stack 48 when it expands to move the arm 274 in a rotational manner downwardly into proximate relationship with the bonding tool 278. This is effected by the movement of the arm 46 in a rotational manner to the right in the direction of arrow 291. The expansion of the piezo stack 48 causes the arm 46 to move about on a flexure or spring member 50. As previously stated, the flexure or spring member 50 is connected by screws 54 and 56 so that as it rotates it can rotate in the direction of arrow 292 in a clockwise manner. This happens when the piezo stack expands. It moves in a counterclockwise manner when the piezo stack is relaxed without any electrical power thereto.

Inasmuch as the piezo stack 48 is an expandable mass not subject to being driven in either direction, a return spring force is utilized in the form of two return springs, one of which is seen as spring 296. These drive the arm 46 in a counterclockwise manner backwardly or in effect moves it such that it rotates upwardly in a counterclockwise manner to allow the arm to move in the direction of arrow 291 to the left.

In effect, the piezoelectric stack 48 allows the driving of the cutter 270 toward the bonding tool 278 when it is energized thereby forming a pusher for the cutter blade. The spring 296 moves it backwardly so the gap reemerges between the cutter blade 270 and the bonding tool 278.

Figure 7:
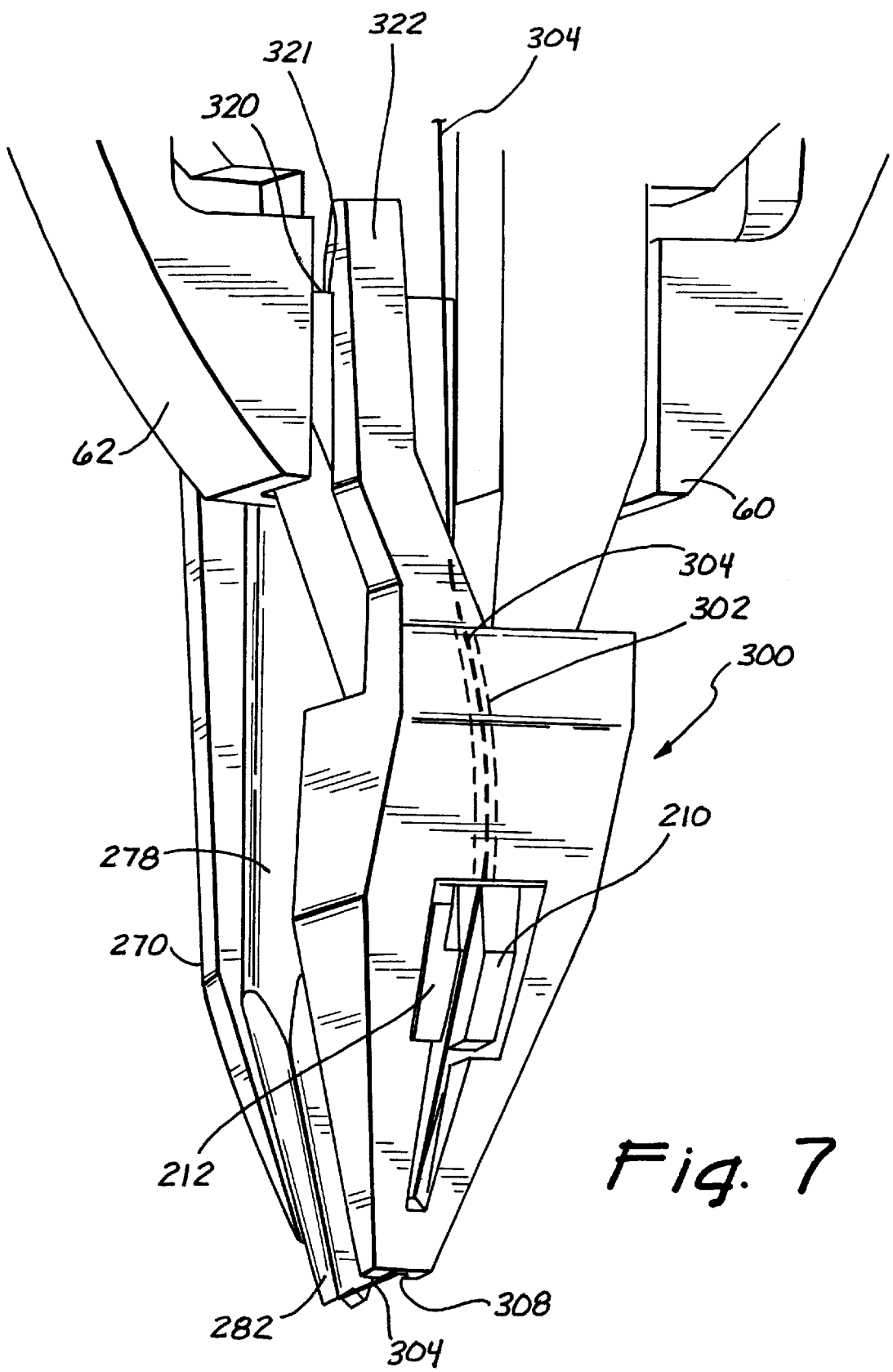
FIG. 7 shows a detailed perspective view that has been fragmented at its upper portion to detail the cutter, bonding tool, wire guide, and a portion of the wire clamps.

Looking more particularly at FIG. 7 it can be seen wherein the wire guide is shown in the form of a wire guide 300. The wire guide 300 has a slot 302 shown dotted in on the inside of the wire guide through which the wire 304 passes. The wire can be seen in a dotted configuration in the passage 302 after it has been passed and threaded through the wire guide 300. The wire guide 300 terminates at a lower opening 308 which allows the exit of the wire 304 shown emanating from and going under the tip 282 of the bonding tool 278. The threading of the wire through the wire guide 300 is such where it also passes between the moving wire clamp 210 and the fixed wire clamp 212. These are attached as shown to the moving clamp arm 60 and the fixed clamp arm 62.

The wire guide 300 is an integrally molded plastic piece or of other integral construction. The integrally molded plastic piece fits on the fixed clamp 212 by means of a step or ledge 320. The step 320 receives an upper appendage or arm 322 that extends downwardly to the wire guide 300. The upper portion of the appendage 322 has a notch or undercut 324 which fits onto the ledge 320 of the fixed clamp 212 and holds it in place.

In this manner, the respective wire clamps 210 and 212 are placed within the wire guide 300 and maintained in situ by the nature of the wire guide 300 being an integral member which maintains them while at the same time being secured to the ledge 320 of the fixed clamp 212.

In effect, a wire guide 300 is provided with an overlayment of the wire clamps 210 and 212 as well as being secured in a snap over manner to the ledge 320 by the undercut 324 engaging it and hanging on it.

Other configurations for the wire guide can be undertaken in order to formulate a holding of the wire clamps 210 and 212 and in the alternative various other elements can be used to surround the clamps 210 and 212 or to pass the wire therebetween. However, it should be understood that the integral wire guide 300 that surrounds the clamps 210 and 212 by being engaged on the fixed clamp accomplishes a guide of the wire while at the same time eliminating superfluous elements of a wire guide as well as arm configurations that would be mechanically extrinsic thereto. Further to this extent, it can be seen that the wire 304 when placed proximate the clamps 210 and 212 is in close juxtaposition to the bond tool 278 and the cutter blade 270.

The foregoing configuration provides for a wire bonder which is improved over the art as to cutting, guiding of wire, providing movement of the cutter blade, providing movement of the clamps, as well as spring biasing the over travel portions and the holding of the entire bonding tool elements at the wire bonding end of the wire bonder head. Consequently, this invention should be read broadly in light of the following claims.

What is claimed is:

1. An ultrasonic wire bonder comprising:
   a bonding head connected for Z axis movement over an electrical or electronic component to which a wire is to be bonded;
   an ultrasonic transducer having a bonding tool connected thereto for bonding a wire; and,
   a flexible support for supporting said bonding tool formed from at least one arcuate arm forming an arc within a plane intersecting the Z axis connected to said bonding tool for flexible movement of said bonding tool in the direction of the Z axis.

2. The bonder as claimed in claim 1 further comprising:
   a wire clamp supported on said at least one arcuate arm.

3. The bonder as claimed in claim 1 further comprising:
   a wire guide supported on said at least one arcuate arm.

4. The bonder as claimed in claim 1 further comprising:
   at least two pairs of at least two arcuate arms, each of said pairs of arcuate arms spread from each other along the Z axis.

5. The bonder as claimed in claim 4 wherein:
   said pairs of arcuate arms comprise three arms
   in substantially the same plans substantially circumscribing a central axis.

6. The bonder as claimed in claim 4 further comprising:
   said pairs of acurate arms are formed of plural stacked sheets of material.

7. The bonder as claimed in claim 4 wherein:

each arcuate arm has a fillet proximate to where it is supported; and, further comprising a pocket proximate to said fillet for said arcuate arm to flex into at its connection to said bonding head.

8. The bonder as claimed in claim 7 further comprising:

a wire clamp supported on said arcuate arms.

9. The bonder as claimed in claim 1 further comprising:

a forcer assembly formed of a magnet and coil connected to said bonding tool for forcing said bonding tool against the wire to be bonded.

10. An ultrasonic wire bonder having a bonding head comprising:

a bonding tool connected to said bonding head;

a pair of arms comprising a wire clamp one of which is fixed and the other movable for clamping the wire to be bonded;

a flexible support connected to said arms comprising at least 2 pairs of arcuate arms surrounding a common Z axis mounted to the bonding head and, each pair of arcuate arms are spaced from each other along said Z axis;

a link connected for moving said movable arm laterally with respect to the fixed arm to form a clamp for said wire; and, an electrical drive having a coil for moving said movable arm by said link against the fixed arm.

11. The bonder as claimed in claim 10 wherein:

a first of said pair of arcuate arms closest to the bonding end of said bonding tool is formed of three stacked sheet like members; and, a second of said pair of arms distal therefrom are formed of two stacked sheet like members.

12. The bonder as claimed in claim 10 further comprising:

a support for said bonding head that moves said head in the Z axis;

a wire cutter connected for movement with said bonding head support; and, a pusher for moving said wire cutter into proximate relationship with the end of said bonding tool for cutting wire when said support moves downwardly in the direction of the Z axis.

13. The bonder as claimed in claim 11 further comprising:

a spacer between each of said sheet like members forming said arcuate arms.

14. The bonder as claimed in claim 11 further comprising:

a fillet in said arms proximate to their connection; and, a space underlying said arms into which said arms proximate said fillets can flex.

15. A wire bonder having a bonding head connected for movement in a Z axis over an electronic or electrical component to which a wire is to be bonded comprising:

a bonding tool connected for movement in the Z axis on a flexible support;

an electrically biased forcer for forcing said bonding tool against a wire that is to be bonded;

a wire cutter connected to said bonding head for cutting movement in the Z axis spaced laterally from said bonding tool prior to cutting movement;

a linkage for moving said cutter laterally toward said bonding tool substantially closing the space between said wire cutter and said bonding tool when wire is to be cut after bonding to place the end of said cutter in lateral proximate relationship to said bonding tool during wire cutting; and, an electrical drive for driving said linkage toward said bonding tool.

16. The wire bonder as claimed in claim 15 wherein:

said electrical drive comprises a piezoelectric member connected for driving said linkage.

17. The wire bonder as claimed in claim 15 wherein:

said flexible support is formed from at least two arcuate arms sharing a common Z axis.

18. The wire bonder as claimed in claim 17 wherein:

said arcuate arms are formed as two sets of arms, one set being closer to the bonding end of said bonding tool and the other set distal therefrom.

19. The wire bonder as claimed in claim 15 further comprising:

a fixed wire clamp arm and a moving wire clamp arm for clamping wire therebetween; and, a wire guide attached to said fixed wire clamp arm for guiding wire into a position to be bonded by said bonding tool.

20. The wire bonder as claimed in claim 1 further comprising:

a forcer movement connected to said bonding tool having at least one magnet and coil for forcing said tool against the wire to be bonded.

21. The wire bonder as claimed in claim 10 further comprising:

a forcer movement comprising at least one magnet and coil connected to said bonding tool for driving said bonding tool against the wire to be bonded.

22. The wire bonder as claimed in claim 15 further comprising:

a forcer movement connected to said bonding tool for driving said bonding tool against the wire to be bonded.

23. A method for ultrasonically bonding a wire to an electrical or electronic component comprising:

providing a support for a wire bonding head that can move said head in the Z axis;

providing a wire bonding tool; and, supporting said bonding tool on at least two arcuate arms having a plane that intersects the Z axis while performing said bond.

24. The method as claimed in claim 13 further comprising:

providing two spaced pairs of at least two arcuate arms which flex to provide flexible movement of the bonding tool in the Z axis.

25. The method as claimed in claim 24 further comprising:

forcing said bonding tool against said wire by a forcer having at least one coil and magnet.

26. The method as claim in claim 23 further comprising:

providing a wire cutter; and, pushing said cutter in the direction of said bonding tool by an electrical driving force before cutting the wire.

27. The method as claimed in claim 23 further comprising:

holding the wire between a fixed clamp arm and a moving clamp arm; and, driving said moving clamp in part by a coil connected to a linkage to said moving clamp.

28. A method of ultrasonically bonding a wire to an electrical or electronic component comprising:

supporting a wire bonding tool on a bonding head for movement in the Z axis;

providing a wire cutter for movement in the Z axis with a gap between said wire cutter and said wire bonding tool prior to cutting;

moving said wire cutter laterally into lateral proximate relationship to said wire bonding tool substantially closing the gap between said bonding tool and said wire cutter; and, cutting a bonded wire while said wire cutter is in proximate longitudinal relationship to said bonding tool and said gap has been closed.

29. The method as claimed in claim 28 further comprising:

supporting said bonding tool on at least two arcuate arms defining a plane that intersects the Z axis.

30. The method as claimed in claim 28 further comprising:

supporting said bonding tool by a first and second set of arcuate arms, each set being distally spaced from each other along the Z axis.

31. An ultrasonic wire bonder comprising:

a bonding head connected for Z axis movement over an electrical or electronic component to which a wire is to be bonded;

an ultrasonic transducer having a bonding tool connected thereto for bonding a wire; and, a flexible support for supporting said bonding tool formed from at least two pairs of at least two arcuate arms, each of said pairs of arcuate arms spread from each other along the Z axis.

* * * * *